(12) United States Patent
Van Der Aa et al.

(10) Patent No.: US 7,649,636 B2
(45) Date of Patent: Jan. 19, 2010

(54) OPTICAL METROLOGY SYSTEM AND METROLOGY MARK CHARACTERIZATION DEVICE

(75) Inventors: Nicolaas Petrus Van Der Aa, Helmond (NL); Arie Jeffrey Den Boef, Waalre (NL); Robert Martinus Maria Mattheij, Helmond (NL); Henricus Gerhardus Ter Morsche, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 219 days.

(21) Appl. No.: 11/641,122

(22) Filed: Dec. 19, 2006

(65) Prior Publication Data

US 2007/0153275 A1 Jul. 5, 2007

Related U.S. Application Data

(63) Continuation-in-part of application No. 11/321,446, filed on Dec. 30, 2005, now abandoned.

(51) Int. Cl.
*G01B 11/14* (2006.01)
(52) U.S. Cl. .................................. 356/625; 250/559.19
(58) Field of Classification Search ................. 356/399, 356/625, 2, 388–398; 353/5, 26; 378/26, 378/29; 716/1, 4, 19–21; 438/5, 7–9, 14, 438/16; 700/95, 97, 103, 117–121, 2, 13; 702/81, 82, 117, 155–159, 166–170, 189; 250/559.01–559.07, 559.19–559.24, 559.26, 250/559.27, 559.11, 548; 355/53, 55, 77; 430/5, 22, 30
See application file for complete search history.

(56) References Cited

U.S. PATENT DOCUMENTS 5,559,601 A * 9/1996 Gallatin et al. ............... 356/490

(Continued)

OTHER PUBLICATIONS

M.G. Moharam, Rigorous coupled-wave analysis of planar-grating diffraction, Jul. 1981, Jouranal of Optical Society of America, vol. 71, No. 7, pp. 811-818.*

(Continued)

*Primary Examiner*—Tarifur Chowdhury
*Assistant Examiner*—Michael Lapage
(74) *Attorney, Agent, or Firm*—Sterne, Kessler, Goldstein & Fox P.L.L.C.

(57) ABSTRACT

An optical metrology system is disclosed that has a measuring system configured to irradiate a metrology mark and record a portion of a reflected, a transmitted, or both, electromagnetic field and a characterization device configured to determine from the recorded field a mark shape parameter indicative of the structure of the metrology mark, the characterization device comprising: a field calculation unit configured to calculate an expected field for reflection, transmission, or both, from a theoretical reference mark based on an algebraic eigenvalue-eigenvector representation of the expected field, a field derivative calculation unit configured to calculate a first order derivative, a higher order derivative, or both, of the expected field with respect to the mark shape parameter by first deriving analytical forms for corresponding derivatives of eigenvalues and eigenvectors of the eigenvalue-eigenvector representation, and an optimization unit configured to use the outputs from the field and field derivative calculation units to determine an optimized mark shape parameter for which the expected field substantially matches the recorded field.

18 Claims, 6 Drawing Sheets

U.S. PATENT DOCUMENTS

| | | | |
|---|---|---|---|
| 5,703,692 | A | 12/1997 | McNeil et al. ............... 356/445 |
| 5,880,838 | A | 3/1999 | Marx et al. ................. 356/351 |
| 5,963,329 | A | 10/1999 | Conrad et al. ............... 356/372 |
| 6,608,690 | B2 | 8/2003 | Niu et al. .................... 356/635 |
| 6,699,624 | B2 | 3/2004 | Niu et al. ....................... 430/5 |
| 6,704,661 | B1 | 3/2004 | Opsal et al. .................... 702/27 |
| 6,721,691 | B2 | 4/2004 | Bao et al. ................... 702/189 |
| 6,738,138 | B2 | 5/2004 | Wei ............................ 356/369 |
| 6,753,961 | B1 | 6/2004 | Norton et al. ............... 356/364 |
| 6,768,983 | B1 | 7/2004 | Jakatdar et al. ............... 706/46 |
| 6,772,084 | B2 | 8/2004 | Bischoff et al. ............. 702/127 |
| 6,785,638 | B2 | 8/2004 | Niu et al. .................... 702/189 |
| 6,813,034 | B2 | 11/2004 | Rosencwaig et al. ........ 356/601 |
| 6,819,426 | B2 | 11/2004 | Sezginer et al. ............. 356/401 |
| 6,856,408 | B2 | 2/2005 | Raymond .................... 356/601 |
| 6,898,537 | B1* | 5/2005 | McGahan .................... 702/76 |
| 6,919,964 | B2 | 7/2005 | Chu ........................... 356/601 |
| 6,928,628 | B2 | 8/2005 | Seligson et al. ................. 716/4 |
| 6,952,271 | B2* | 10/2005 | Niu et al. .................... 356/625 |
| 6,972,852 | B2 | 12/2005 | Opsal et al. ................. 356/625 |
| 6,974,962 | B2 | 12/2005 | Brill et al. .................... 250/548 |
| 6,987,572 | B2 | 1/2006 | Lakkapragada et al. ..... 356/601 |
| 7,046,376 | B2 | 5/2006 | Sezginer ..................... 356/601 |
| 7,061,615 | B1 | 6/2006 | Lowe-Webb ................ 356/401 |
| 7,061,623 | B2 | 6/2006 | Davidson .................... 356/497 |
| 7,061,627 | B2 | 6/2006 | Opsal et al. ................. 356/601 |
| 7,068,363 | B2 | 6/2006 | Bevis et al. ............... 356/237.5 |
| 2002/0033954 | A1 | 3/2002 | Niu et al. .................... 356/601 |
| 2004/0119970 | A1 | 6/2004 | Dusa et al. ............... 356/237.1 |
| 2005/0209816 | A1 | 9/2005 | Vuong et al. ................ 702/167 |
| 2005/0274901 | A1* | 12/2005 | Fabrikant et al. ............ 250/397 |
| 2006/0033921 | A1 | 2/2006 | Den Boef et al. ........... 356/446 |
| 2006/0066855 | A1 | 3/2006 | Den Boef et al. ........... 356/401 |
| 2006/0126074 | A1 | 6/2006 | Van Der Werf et al. ..... 356/489 |
| 2006/0139592 | A1 | 6/2006 | Den Boef et al. ............. 355/53 |
| 2007/0153274 | A1 | 7/2007 | Van Der Aa et al. |

OTHER PUBLICATIONS

Durbha V. Murthy, Derivatives of eigenvalue and eigenvectors of a general complex matrix, Jan. 5, 1987, International journal for numerical methods in engineering, vol. 26, pp. 293-311.*

M. G. Moharam and T.K. Gaylord, "Rigorous Coupled-Wave Analysis of Planar-Grating Diffraction", J. Opt. Soc. Am 71 (7), (1981) pp. 811-818.

M. G. Moharam et al., "Formulation for Stable and Efficient Implementation of the Rigorous Coupled-Wave Analysis of Binary Gratings", J. Opt. Soc. Am A 12 (5), (1995) pp. 1068-1076.

M. G. Moharam et al., "Stable Implementation of the Rigorous Coupled-Wave Analysis for Surface-Relief Gratings: Enhanced Transmittance Matrix Approach", J. Opt. Soc. Am A 12 (5), (1995) pp. 1077-1086.

L. Li, "Use of Fourier Series in the Analysis of Discontinuous Periodic Structures", J. Opt. Soc. Am. A 13 (9), (1996) pp. 1870-1876.

L. Li et al., "Rigorous and Efficient Grating-Analysis Method Made Easy for Optical Engineers", Appl. Opt. 38 (2), (1999) pp. 304-313.

D.V. Murthy et al., "Derivatives of Eigenvalues and Eigenvectors of a General Complex Matrix", International Journal for Numerical Methods in Engineering 26, (1988) pp. 293-311.

European Search Report issued for European Patent Application No. 06256399.4-2222, dated Mar. 1, 2007.

* cited by examiner

Fig. 6

| TE polarization | TM polarization |
|---|---|
| *Initialization* $\begin{bmatrix} F_{K+2} \\ G_{K+2} \end{bmatrix} := \begin{bmatrix} I \\ jY_{K+2} \end{bmatrix}$ | *Initialization* $\begin{bmatrix} F_{K+2} \\ G_{K+2} \end{bmatrix} := \begin{bmatrix} I \\ jZ_{K+2} \end{bmatrix}$ |
| *Main part* $(i = K+1, K, ..., 2)$ $\begin{bmatrix} A_i \\ B_i \end{bmatrix} := \begin{bmatrix} W_i & W_i \\ V_i & -V_i \end{bmatrix}^{-1} \begin{bmatrix} F_{i+1} \\ G_{i+1} \end{bmatrix} = \frac{1}{2} \begin{bmatrix} W_i^{-1} & V_i^{-1} \\ W_i^{-1} & -V_i^{-1} \end{bmatrix} \begin{bmatrix} F_{i+1} \\ G_{i+1} \end{bmatrix}$ $\begin{bmatrix} F_i \\ G_i \end{bmatrix} := \begin{bmatrix} W_i & W_i X_i \\ V_i & -V_i X_i \end{bmatrix} \begin{bmatrix} I \\ B_i A_i^{-1} X_i \end{bmatrix}$ ||
| *Final equation* $\begin{bmatrix} d_0 \\ jd_0 n_1 \cos\theta \end{bmatrix} + \begin{bmatrix} I \\ -jY_1 \end{bmatrix} R = \begin{bmatrix} F_2 \\ G_2 \end{bmatrix} T_2$ | *Final equation* $\begin{bmatrix} d_0 \\ jd_0 \cos\theta/n_1 \end{bmatrix} + \begin{bmatrix} I \\ -jZ_1 \end{bmatrix} R = \begin{bmatrix} F_2 \\ G_2 \end{bmatrix} T_2$ |

OPTICAL METROLOGY SYSTEM AND METROLOGY MARK CHARACTERIZATION DEVICE

This application is a continuation-in-part application of U.S. patent application Ser. No. 11/321,446, filed Dec. 30, 2005 now abandoned, which application is incorporated herein its entirety by reference.

1. FIELD

The present invention relates to a substrate alignment system for a lithographic apparatus.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Alignment of a substrate relative to a projection system or a patterning device and other process control procedures can be carried by reference to optical measurements of metrology marks (such as alignment marks). For example, an optical measurement system may be provided to reflect radiation from one or more metrology marks formed on the substrate or patterning device. Periodic alignment marks, such as gratings, may be used, for example, and the position determined by reference to a center of symmetry or other characteristic property of the grating. Processing of the substrate can distort the metrology marks, which can make it difficult for the optical measurement system to operate effectively. For example, where alignment marks are being measured, the distortion may compromise determination of the alignment mark position. Calculating how reflected radiation may change due to the distortion may be time consuming and expensive.

3. SUMMARY

It is desirable, for example, to provide an improved apparatus and method for optical measurement of metrology marks.

According to an aspect of the invention, there is provided an optical metrology system, comprising a measuring system configured to irradiate a metrology mark and record a portion of a reflected, a transmitted, or both, electromagnetic field; and a characterization device configured to determine from the recorded field a mark shape parameter indicative of the structure of the metrology mark, the characterization device comprising: a field calculation unit configured to calculate an expected field for reflection, transmission, or both, from a theoretical reference mark based on an algebraic eigenvalue-eigenvector representation of the expected field, a field derivative calculation unit configured to calculate a first order derivative, a higher order derivative, or both, of the expected field with respect to the mark shape parameter by first deriving analytical forms for corresponding derivatives of eigenvalues and eigenvectors of the eigenvalue-eigenvector representation, and an optimization unit configured to use the outputs from the field and field derivative calculation units to determine an optimized mark shape parameter for which the expected field substantially matches the recorded field.

According to an aspect of the invention, there is provided a lithographic apparatus, comprising: an optical metrology system, including a measuring system configured to irradiate an alignment mark on a substrate and record a portion of a reflected, a transmitted, or both, electromagnetic field, a characterization device configured to determine from the recorded field a mark shape parameter indicative of the structure of the alignment mark, the characterization device comprising: a field calculation unit configured to calculate an expected field for reflection, transmission, or both, from a theoretical reference mark based on an algebraic eigenvalue-eigenvector representation of the expected field, a field derivative calculation unit configured to calculate a first order derivative, a higher order derivative, or both, of the expected field with respect to the mark shape parameter by first deriving analytical forms for corresponding derivatives of eigenvalues and eigenvectors of the eigenvalue-eigenvector representation, and an optimization unit configured to use the outputs from the field and field derivative calculation units to determine an optimized mark shape parameter for which the expected field substantially matches the recorded field; and a substrate position determining device configured to derive a position of the substrate using the optimized mark shape parameter determined by the characterization device.

According to an aspect of the invention, there is provided a method of characterizing a metrology mark, comprising: irradiating a metrology mark and recording a portion of a reflected, a transmitted, or both, electromagnetic field; determining from the recorded field a mark shape parameter indicative of the structure of the metrology mark; calculating an expected field for reflection, transmission, or both, from a theoretical reference mark based on an algebraic eigenvalue-eigenvector representation of the expected field; calculating a first order derivative, a higher order derivative, or both, of the expected field with respect to the mark shape parameter by first deriving analytical forms for corresponding derivatives of eigenvalues and eigenvectors of the eigenvalue-eigenvector representation; and using the results of the calculating to determine an optimized mark shape parameter for which the expected field substantially matches the recorded field.

According to an aspect of the invention, there is provided a device manufacturing method, comprising: characterizing a metrology mark formed on a substrate by: irradiating a metrology mark and recording a portion of a reflected, a transmitted, or both, electromagnetic field; determining from the recorded field a mark shape parameter indicative of the structure of the metrology mark; calculating an expected field for reflection, transmission, or both, from a theoretical reference mark based on an algebraic eigenvalue-eigenvector representation of the expected field; calculating a first order derivative, a higher order derivative, or both, of the expected field with respect to the mark shape parameter by first deriving analytical forms for corresponding derivatives of eigenvalues and eigenvectors of the eigenvalue-eigenvector representation; and using the results of the calculating to determine an optimized mark shape parameter for which the expected field substantially matches the recorded field; and aligning the substrate using the result of the characterization.

4. BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6 depicts an algorithm for the enhanced transmittance matrix approach for the RCWA method.

5. DETAILED DESCRIPTION

Figure 1:
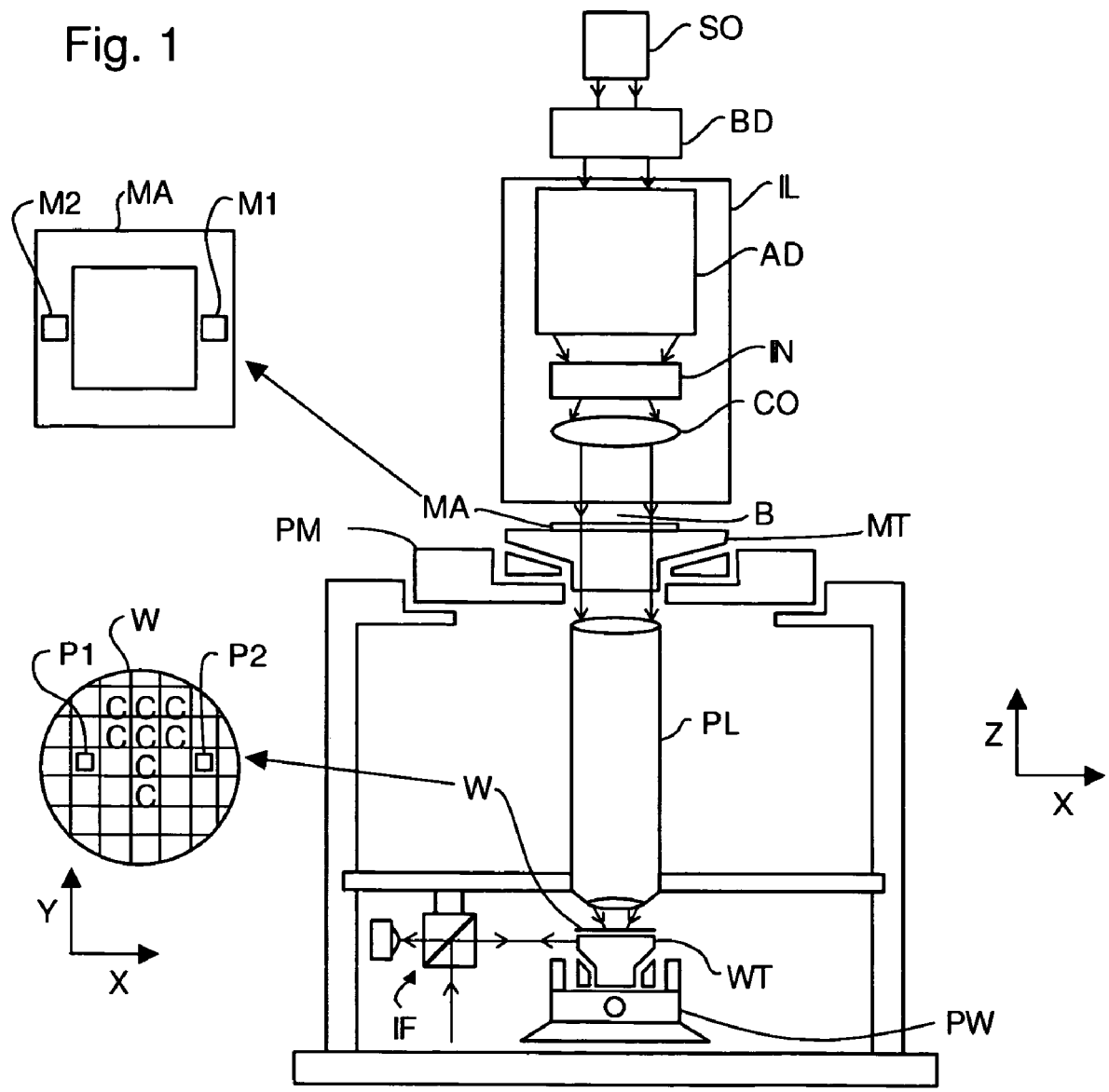
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type o f projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning devices, such as a programmable mirror array of a type as referred to above.

Combinations and/or variations on the above described modes of use or entirely different modes of use may also be employed.

Figure 2:
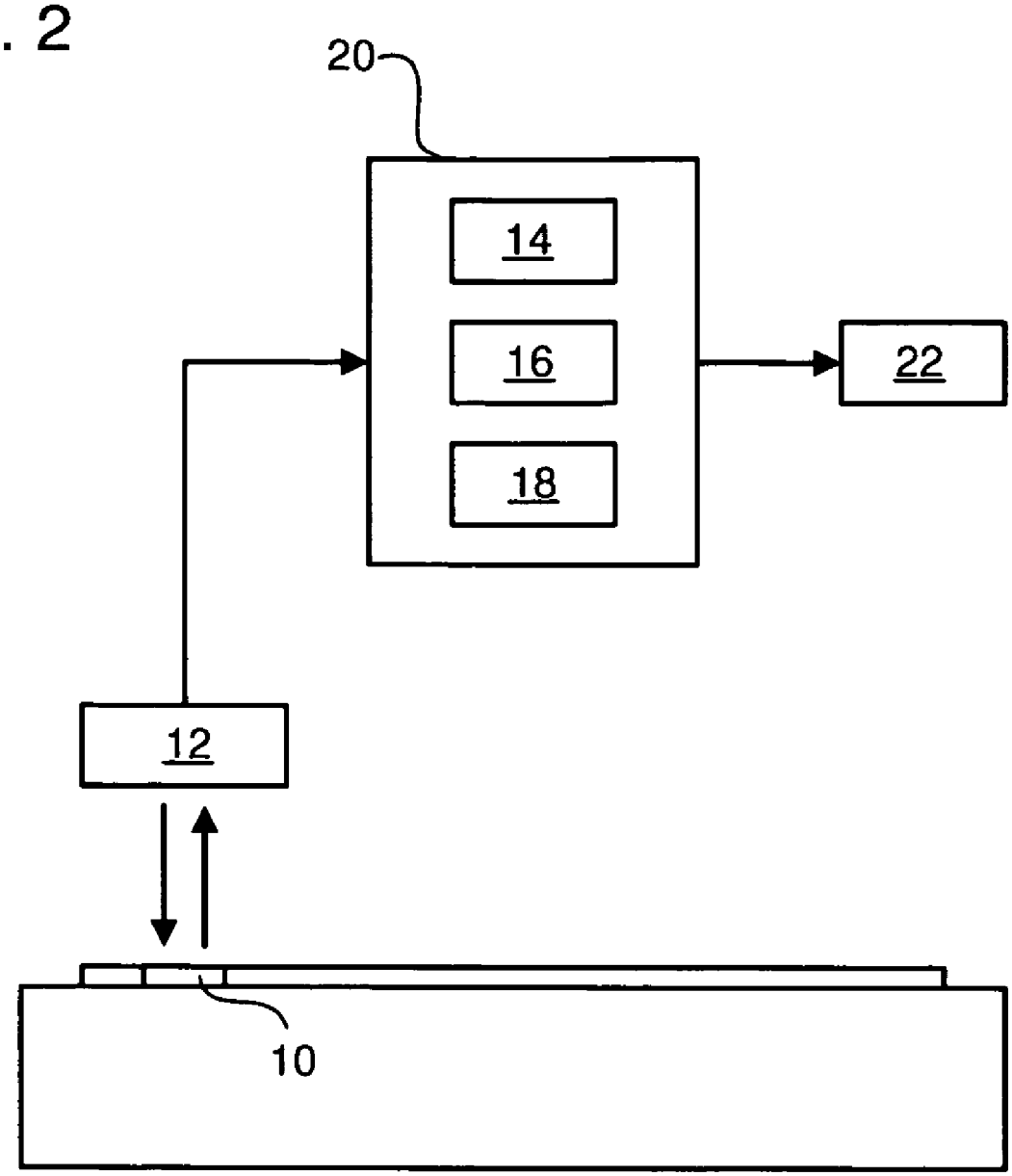
FIG. 2 depicts a substrate alignment system according to an embodiment of the invention.

FIG. 2 schematically shows an optical metrology system for a lithographic apparatus according to an embodiment of the invention. A measuring system 12 is provided that is configured to irradiate a metrology mark 10 on, for example, a substrate W and record at least a portion of the radiation reflected from it. In the discussion that follows, it is assumed that the radiation is reflected from the metrology mark 10 but the measuring system 12 could alternatively be configured to detect transmitted radiation. The measuring system 12 may comprise separate or integral components to respectively irradiate and record the radiation. The radiation may be recorded in terms of a spatial distribution of intensity (or optical power/flux) and/or in terms of one or more polarization components.

In the example below, the optical metrology system is used to measure alignment marks on a substrate but it can also be applied in a variety of other contexts. For example, the optical metrology system can be applied to scatterometry for critical dimension (CD) metrology. In particular, the metrology system may be used for angle-resolved scatterometry.

The optical metrology system may be applied as part of a lithography apparatus or as part of a substrate processing (for example, etching or metrology) apparatus.

In the example where the metrology mark 10 is an alignment mark, if the form of the alignment mark 10 on the substrate W is known exactly, it would be possible directly to determine its position from the recorded reflected or transmitted field. Similarly, for other types of metrology mark, the information to be derived from measurement of the mark will be maximal when the form of the mark is most well defined. However, this may not be the case, for example, due to imperfect initial formation of the metrology mark 10 and/or because of distortion of the metrology mark 10 during handling and/or processing of the substrate W between and/or during previous exposure(s).

In order to overcome this problem, a characterization device 20 is provided that is capable of determining the current state of the metrology mark 10 by reference to one or more metrology mark shape parameters. This is achieved by iteratively varying a theoretical mark until a reflected or transmitted field calculated for the theoretical mark matches the measured field (or becomes acceptably close). The metrology mark shape parameters for which the matching occurs effectively characterize the metrology mark 10.

The characterization device 20 comprises a field calculation unit 14, a field derivative calculation unit 16 and an optimization unit 18. The field calculation unit 14 is configured to calculate an expected field for a given set of mark shape parameters. Detailed examples of how this calculation may be carried out are given further below. However, in each case a field solution is obtained based on an algebraic eigen-value-eigenvector representation of the field, the differential equation to be solved incorporating the physical structure of the theoretical metrology mark. The matrix from which the eigenvalues and eigenvectors are to be computed correspond to a coefficient matrix of the differential equation.

For example, as will be described in further detail below, one way in which the metrology mark may be described is by modeling it as a plurality of layers parallel to the substrate W. In this representation, a matrix may be formed comprising Fourier components of the complex permittivity for each layer.

The optimization unit 18 is configured to vary the values of the mark shape parameters in order to match a calculated expected field to the field that is actually measured (i.e. to minimize a difference between the calculated and measured fields). In order to do this effectively, first and/or higher order derivatives of the field are obtained with respect to one or more of the mark shape parameters in order to implement the minimization routine. The derivatives provide information about how the field changes locally with respect to mark shape parameters. This information is also known as "sensitivity" information because it relates to how sensitive the field is to changes in the parameters. The minimization routine uses the sensitivity information to decide how to vary the mark shape parameters in order to move most quickly towards the desired solution (i.e. to match the calculated reflected field to the measured reflected field). The derivatives are determined by the field derivative calculation unit 16. One way in which the field derivatives could be obtained is by calculating the field separately for two neighboring values of a particular mark shape parameter—the finite difference technique. This approach is explained below.

Finite Difference Technique

According to the finite difference technique, the sensitivity of the reflected field R to changes in a parameter or parameters $\Delta p$ and/or $\Delta q$ is given by expressions of the following nature (analogous expressions exist for the transmitted intensity T):

$$\frac{\partial R}{\partial p} \approx \frac{R(p+\Delta p) - R(p-\Delta p)}{2\Delta p},$$

$$\frac{\partial^2 R}{\partial p^2} \approx \frac{R(p+\Delta p) - R(p) + R(p-\Delta p)}{(\Delta p)^2},$$

$$\frac{\partial^2 R}{\partial p \partial p} \approx \frac{R(p+\Delta p, q+\Delta q) - R(p+\Delta p, q-\Delta q) - R(p-\Delta p, q+\Delta q) + R(p-\Delta p, q-\Delta q)}{4\Delta p \Delta q}$$

This technique is independent of the method that is selected to compute the field amplitudes R. The field is computed by evaluating the Rayleigh expansion which the field amplitudes are part of. As can be seen, even for first and second order derivatives with respect to one parameter only, two field evaluations (each requiring solutions of eigenvalue problems) are needed. For mixed second order derivatives, the number of needed solutions doubles to four. In general, derivatives with respect to more variables and/or higher order derivatives will require further solutions of the eigenvalue-eigenvector problem. Optimization using derivatives calculated in this way may require a considerable amount of time and/or computational resources.

According to an embodiment, an improved apparatus is provided in which the field derivative calculation unit 16 is configured to calculate the required field derivatives by first deriving analytical forms for corresponding derivatives of eigenvalues and eigenvectors of the eigenvalue-eigenvector representation of the electromagnetic field. The field derivatives can then be obtained directly without having to solve the eigenvalue-eigenvector problem many times for each derivative calculation. The characterization device can therefore be implemented with more modest computer hardware and/or be configured to operate more quickly.

Details of how the eigenvalue and eigenvector derivatives can be found are given below for the specific example of the Rigorous Coupled-Wave Analysis (RCWA) approach to calculating the sensitivity.

Where the metrology mark is an alignment mark, for example, the position of the substrate W (or other component to be aligned) may now be determined by a substrate position determining device 22, based on the optimized mark shape parameters.

Figure 3:
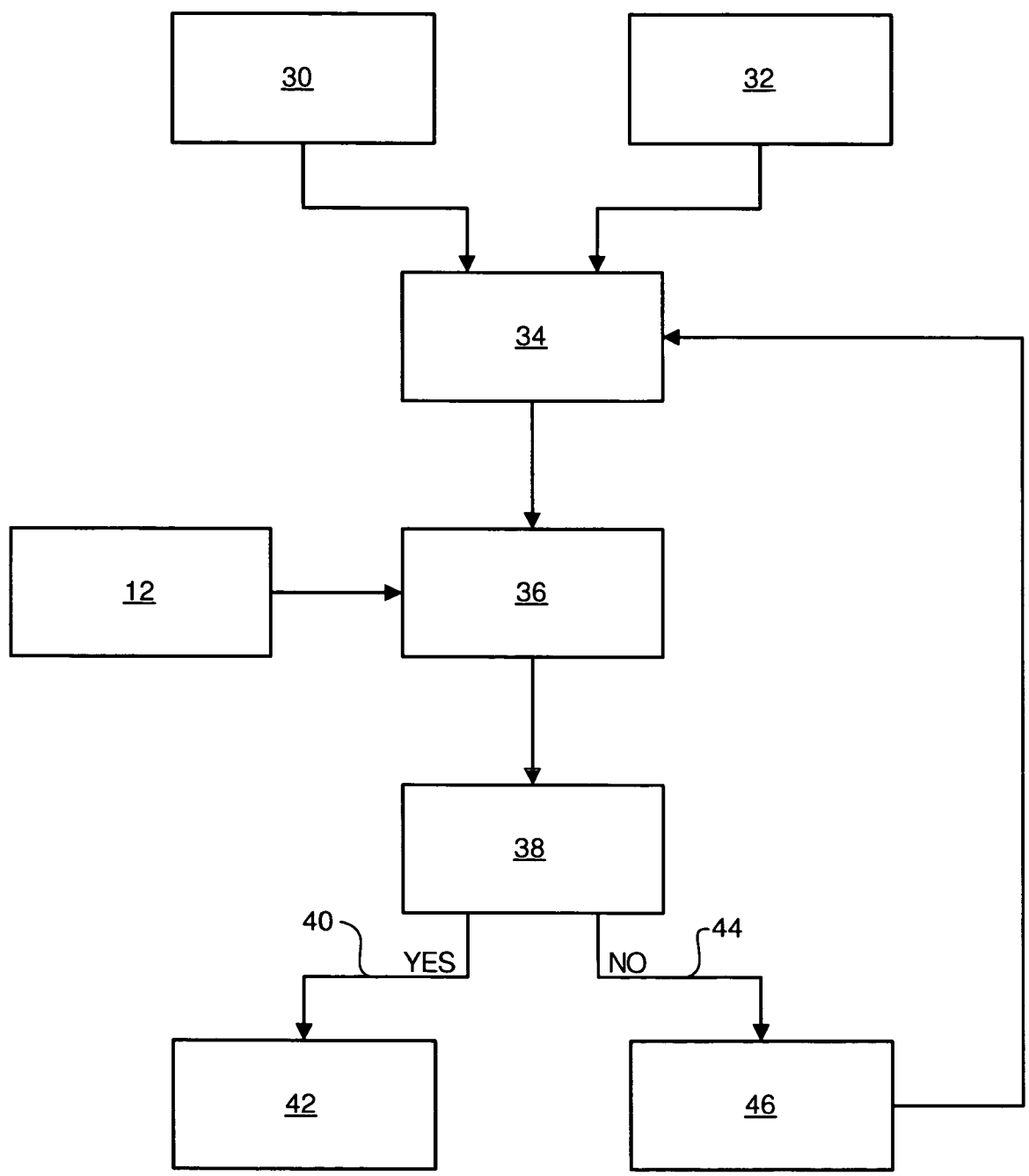
FIG. 3 depicts a method of determining mark shape parameters from radiation reflected from a metrology mark according to an embodiment of the invention.

FIG. 3 illustrates how the process may be carried out according to an embodiment of the invention. In box 30, a user inputs mark shape parameters that define the metrology mark 10 as it was supposed to initially have been written to the substrate (i.e. free of any distortion). Alternatively or additionally, information might be available about how the substrate W has been processed since the mark was initially written and, therefore, how the mark might be expected to have been distorted. A more accurate set of shape parameters may, in this case, be input via box 32. Calibration measurements may be used, for example, to determine typical values for mark shape parameters after particular processing sequences. Additionally or alternatively, means may be provided for carrying out a rough estimation of the mark distortion in order to obtain improved mark shape parameters. Starting with improved mark shape parameters is useful because it reduces the risk of the optimization unit 18 failing to find the best match with the reflected or transmitted field because it falls into a local non-optimal minimum in mark shape parameter space.

The initial mark shape parameters are input from box 30 or box 32 to a field calculation step 34 in which the expected field is calculated. The resulting field is compared in step 36 with the measured reflected field input from the measuring device 12. A difference is forwarded to a judging step 38. If it is judged that the difference is smaller than a certain threshold (branch 40—"YES") then the mark shape parameters are output as optimized mark shape parameters and effectively characterize the metrology mark. Where the metrology mark is an alignment mark, the mark shape parameters may be forwarded to a substrate position determining step 42, which determines a position of the substrate W on the basis of these parameters. If it is judged, on the other hand, that the difference is larger than a certain threshold (branch 44—"NO") then the mark shape parameters are updated in step 46 and fed back to the calculation step 34 where the process is repeated until an acceptable match between the calculated and measured fields is obtained. The updating step 46 uses the field derivatives calculated by the field derivative calculation unit 16 to determine how to update the mark shape parameters. A number of possible approaches may be used for the optimization process. For example the following methods may be used: "steepest descent" (which uses only first order derivatives) and "Newton's method" (which uses also second order derivatives).

Field Calculation Overview—Eigenvalue-Eigenvector Representation

One way in which the eigenvalue-eigenvector representation may be set up, and a solution obtained for the diffracted radiation (either reflected or transmitted), is by using the RCWA method (M. G. Moharam and T. K. Gaylord, "Rigorous coupled-wave analysis of planar-grating diffraction", J. Opt. Soc. Am 71, 811-818 (1981)). This method obtains a direct solution of Maxwell's equations for diffraction by grating structures. A key feature of this particular method is that the grating domain is divided into thin horizontal layers with piecewise constant refractive indices in order to use Fourier expansion techniques. An enhanced transmittance matrix approach has been developed (M. G. Moharam and T. K. Gaylord, "Stable implementation of the rigorous coupled-wave analysis for surface-relief gratings: enhanced transmittance matrix approach", J. Opt. Soc. Am. A 12, 1077-1086 (1995)), which is a stable way for the RCWA method to solve diffraction problems for multi-layer grating profiles. Further improvements were described in Lifeng Li, "Use of Fourier series in the analysis of discontinuous periodic structures", J. Opt. Soc. Am. A 13, 1870-1876 (1996), relating to TM polarization and included introducing a correction to the Fourier factorization rules for truncated series. At least partly as a result of these improvements, RCWA is an easy to use algorithm, which is applicable to a wide range of multi-layer grating structures.

An alternative to RCWA is the C method (see L. Li, J. Chandezon, G. Granet and J. Plumey, "Rigorous and efficient grating-analysis method made easy for optical engineers", Appl. Opt. 28, 304-313 (1999)). This approach uses the fact that if the interface were a flat line, the field solution would be given by the two Rayleigh expansions for the entire domain. The C method proceeds by conceptually flattening the interface to a flat line by using a specially adapted coordinate system. Since the C method has similar features to the RCWA method, the progress made with the RCWA algorithm can also be exploited to implement the C method. For example, the mathematics introduced by Lifeng Li (see above) to solve convergence issues for the RCWA algorithm are also applicable to the C method.

General Diffraction Grating Theory

General diffraction grating theory is relevant for both RCWA and the C method. A grating structure may be periodic in the x direction (i.e. parallel to the substrate W) with period Λ and constant along y (i.e. parallel to the substrate surface but perpendicular to x). A linearly polarized plane wave, defined with free-space wavelength $\lambda_0$, may be incident upon the grating structure at arbitrary angles θ and φ. The electromagnetic fields are assumed to be time-harmonic and satisfy Maxwell's equations, which can be simplified by assuming the grating materials are linear, homogeneous, isotropic, non-magnetic, time-invariant and source-free. Due to the periodicity of the grating, the Floquet condition can be imposed, which introduces a phase difference originating from the incident field. Since the grating structure is independent of the y coordinate, the field will also not depend on y. Both the periodicity and the y independency enables the restriction of the computational domain to a 2D domain.

The way in which RCWA and the C method solve this mathematical problem is different from a physical point of view, though they still keep important similarities as will be shown later. The application of the RCWA method to the present problem is described first.

RCWA

For notational convenience, a restriction is made to planar diffraction. The theory of planar diffraction can be extended to planar diffraction with TE and TM polarization, since these polarizations are the extreme cases, but a mixture of both is also possible. However, these mixtures can be described by a superposition of the extremes.

Figure 4:
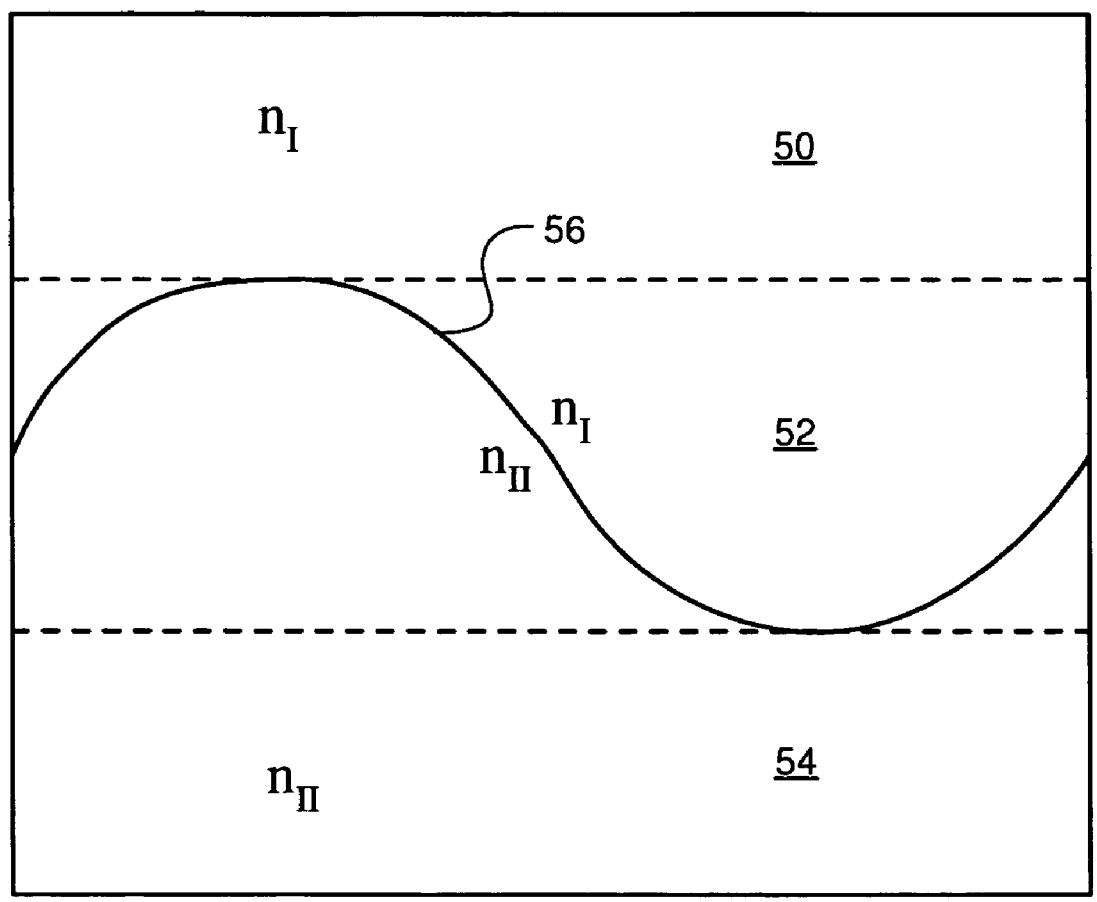
FIG. 4 illustrates the domains where the Rayleigh expansions hold.

For the TE polarization case, the electric field only has a y component. Above and below the grating profile 56 (regions 50 and 54 respectively in FIG. 4), the material properties do not change and therefore the solution of the time-harmonic Maxwell equations can be described by the Rayleigh expansion:

$$E_{I,y}(x,z) = \exp[-jk_0 n_I(x\sin\theta + z\cos\theta)] + \sum_n R_n \exp[-j(k_{xn}x - k_{I,zn}z)],$$

$$E_{II,y}(x,z) = \sum_n T_n \exp[-j(k_{xn}x + k_{II,zn}(z-D))],$$

with $$k_{xn} = k_0[n_I \sin\theta - n(\lambda_0/\Lambda)], k_{I,zn} = (k_0^2 n_I^2 - k_{xn}^2)^{1/2}, k_{II,zn} = (k_0^2 n_{II}^2 - k_{xn}^2)^{1/2}.$$

Here, $E_{I,y}$ and $E_{II,y}$ denote the y-component of the electric field of the media above and below the grating, respectively. In a similar way, $n_I$ and $n_{II}$ are the refractive indices. The reflected and transmitted field amplitudes $R_n$ and $T_n$ are unknowns, one or both of which will correspond to the signal to be detected by the metrology mark measuring system. For example, the reflected intensity may be measured, which can expressed as R*R. The thickness of the grating structure is given by D and $k_0$ is the wave number in vacuum.

Figure 5:
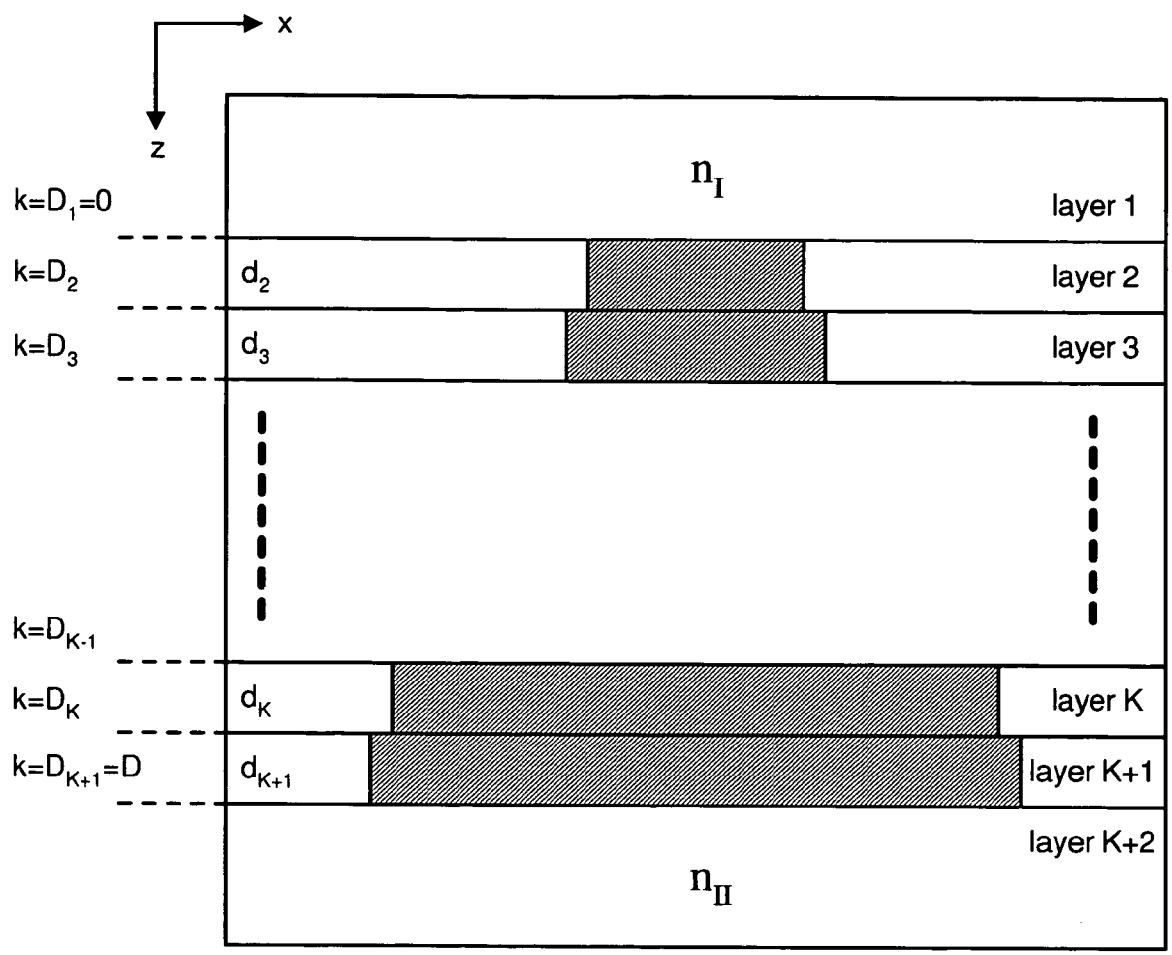
FIG. 5 depicts a representation of a metrology mark in terms of RCWA parameters.

The Rayleigh expansion is known per se from R. Petit (editor), Electromagnetic Theory of Gratings, Springer-Verlag, 1980. RCWA connects these two Rayleigh expansions by introducing K thin horizontal layers in the grating domain (see FIG. 5) where the permittivity distribution ε is approximated by a piecewise constant function of x only. Note that for TE polarization, Maxwell's equations imply the presence of both x and z components of the magnetic field. Then, the time-harmonic Maxwell equations merge into one equation for each layer i (i=2, ..., K+1), namely $$\frac{\partial^2}{\partial z^2} E_{i,y}(x,z) = -k_0^2 \frac{\varepsilon_i(x)}{\varepsilon_0} E_{i,y}(x,z) - \frac{\partial^2}{\partial x^2} E_{i,y}(x,z),$$

for $-\Lambda/2 \leq x \leq \Lambda/2$ and $D_i < z < D_{i+1}$, where $E_{i,y}$ is the electric field inside layer i. For all other layers i (i=2, ..., K+1), the (relative) permittivity and the electric field can be Fourier expanded.

$$\varepsilon_i(x) = \sum_n \epsilon_{i,n} \exp[j(2\pi/\Lambda)nx], E_{i,y}(x,z) = \sum_n S_{i,n}(z)\exp[-jk_{xn}x].$$

If these expansions are substituted into the above equation, truncated to 2N+1 terms, and $z' = k_0 z$ is introduced, the result will be an ordinary differential equation of the second order, $$\frac{d^2}{dz'^2} S_i(z') = A_i S_i(z')$$

with coefficient matrix $A_i := K_x^2 - E_i$. Matrix $E_i$ is a Toeplitz matrix containing the Fourier components of the complex relative permittivity in layer i. Matrix $K_x$ is a diagonal matrix with elements $k_{xn}/k_0$ ($-N \leq n \leq N$) on its diagonal and $S_i$ is a vector consisting of the unknown functions $S_{i,n}(z)$. The gen eral solution of this truncated system is given by the eigenvalues and eigenvectors of matrix $A_i$.

$$S_i(z) = \sum_{l=1}^{2N+1} w_{i,l}(c_{i,l}^+ \exp[-k_0 q_{i,l}(z - D_{i-1})] + c_{i,l}^- \exp[k_0 q_{i,l}(z - D_i)]).$$

Here, $w_{i,l}$ are eigenvectors of $A_i$. The scalars $q_{i,l}$ are the roots of the eigenvalues of matrix $A_i$ with a positive real part. The coefficients $C_{i,l}^+$ and $C_{i,l}^-$ are still unknown.

To implement the boundary conditions, an expression for the x component of the magnetic field should also be available. According to Maxwell's equations, this component can be expressed in terms of $E_y$ as $$H_{i,x}(x,z) = \frac{1}{k_0}\frac{d}{dz}E_{i,y}(x,z).$$

Now, the fields within two subsequent layers are connected by the boundary condition at the interface, which states that the tangential field components are continuous. When also the Rayleigh expansions are truncated up to 2N+1 terms, K+1 systems of equations are obtained for each interface. The coefficients $C_{i,l}^+$ and $C_{i,l}^-$ can be eliminated such that one matrix equation is obtained for the unknown reflected and transmitted field amplitudes. The equation that is solved by the standard or enhanced transmittance matrix approach is given by $$\begin{bmatrix} d_0 \\ jd_0 n_1 \cos\theta \end{bmatrix} + \begin{bmatrix} I \\ -jY_1 \end{bmatrix} R = \prod_{i=2}^{K+1}\left(\begin{bmatrix} W_i & W_i X_i \\ V_i & -V_i X_i \end{bmatrix}\begin{bmatrix} W_i X_i & W_i \\ V_i X_i & -V_i \end{bmatrix}^{-1}\right)\begin{bmatrix} I \\ jY_{K+2} \end{bmatrix} T,$$

where $W_i$ consists of column vectors $w_{i,l}$, $Q_i$ is a diagonal matrix consisting of elements $q_{i,l}$ and $V_i = W_i Q_i$, which is the result of the above Maxwell equation. Vector $d_0$ is an all-zero vector except for element N+1 which equals 1. The diagonal matrices $Y_1$ and $Y_{K+2}$ consist of elements $k_{I,zn}/k_0$ and $k_{K+2,zn}/k_0$, respectively. The only matrix that contains layer thickness information is $X_i$ which is a diagonal matrix with entries equal to $\exp(-k_0 d_i q_{i,n})$.

In a similar way, for TM polarization, the final matrix equation becomes $$\begin{bmatrix} d_0 \\ jd_0 \cos\theta/n_1 \end{bmatrix} + \begin{bmatrix} I \\ -jZ_1 \end{bmatrix} R = \prod_{i=2}^{K+1}\left(\begin{bmatrix} W_i & W_i X_i \\ V_i & -V_i X_i \end{bmatrix}\begin{bmatrix} W_i X_i & W_i \\ V_i X_i & -V_i \end{bmatrix}^{-1}\right)\begin{bmatrix} I \\ jZ_{K+2} \end{bmatrix} T.$$

The only differences compared to TE polarization is that for TM polarization matrices $W_i$ and $Q_i$ are computed for matrix $A_i := P_i^{-1}(K_x E_i^{-1} K_x - I)$, where $P_i$ is the Toeplitz matrix containing the Fourier coefficients of the reciprocal permittivity. Also matrix $V_i$ is defined differently, namely $V_i = P_i^{-1} W_i Q_i$. Note, that in the definition of matrix $A_i$, the correct Fourier factorization rules derived by Li (see above) have been used. Further, because of a slightly different Rayleigh expansion, diagonal matrices $Z_I$ and $Z_{K+2}$ are introduced with elements $k_{I,zn}/k_0 n_I$ and $k_{K+2,zn}/k_0 n_{K+1}$.

Solving the above equations directly is unstable for thick layers because the inverse matrix of $X_i$ has to be computed. However, the enhanced transmittance matrix approach may be used, and the resulting algorithm is summarized for both polarizations in FIG. 6.

The main feature of the enhanced transmittance matrix approach is that a substitution is used for the transmitted field amplitudes, namely $T = A_{K+1}^{-1} X_{K+1} T_{K+1}$, and similar substitutions for $T_i$, i=K, K−1, . . . , 2. This substitution avoids the computation of $X_i^{-1}$ and therefore removes the reason for instabilities. The transmitted field amplitudes can be computed by $T = A_{K+1}^{-1} X_{K+1} \ldots A_2^{-1} X_2 T_2$.

When the reflected and transmitted field amplitudes have been found by solving the final step of the enhanced transmittance matrix approach, the diffraction efficiencies can be computed as follows:

$$DE_{rn} = C_r R_n R_n^*, DE_{tn} = C_t T_n T_n^*$$

where $C_r$ and $C_t$ depend on the polarization but are otherwise constants.

C Method

The C method uses the fact that if the interface were a flat line, the field solution would be given by the two Rayleigh expansions (see equations for $E_{I,y}$ and $E_{II,y}$ above) for the entire domain. As mentioned above, the basic feature of the C method is to flatten the interface to a flat line using a specially devised coordinate system. The involved coordinate transformation that is used for interfaces which are described by a function z=a(x), is given by:

$$u=x, v=y, w=z-a(x)$$

This coordinate transformation is substituted into the Rayleigh expansion to produce the generalized Rayleigh expansion:

$$F(u,w) = \sum_{m=-\infty}^{\infty} A_m \exp(-ik_{xm}u - i\rho w)$$

with ρ another unknown. Since the second derivative has to be computed with respect to w because of the Helmholtz equation, ρ will be a kind of eigenvalue. The basic characteristic of this generalized Rayleigh expansion is that it is valid everywhere in the domain. So, by determining $A_m$ and ρ, the solution is obtained.

By introducing the generalized version of the Rayleigh expansion and the coordinate transformation into the time-harmonic Maxwell equations and use of Fourier expansions for the interface, again an eigenvalue system is obtained. However, for the C method an eigenvalue system is obtained for each medium instead of each layer. Again, the reflected and transmitted field amplitudes are found by using the boundary conditions, which state that the tangential components of the field should be continuous.

Corresponding Features

Both the RCWA and the C method convert the problem into an algebraic eigenvalue system that has to be solved to obtain the far field. Solving this eigenvalue system is computationally challenging and the speed of the overall process is determined by this computation. The particular way the eigenvalue system emerges from the C method is different from that of the RCWA algorithm. The essential resemblance for both methods is that both methods try to eliminate the dependency of the medium properties on directions other than the direction in which the periodicity can be found. Whereas RCWA cuts its region into slices, the C method uses a coordinate transformation to obtain this. The result of this difference is that, in general, RCWA uses many layers to obtain sufficient accuracy, while the C method encounters more extended systems, but only one for each medium. Other processes may be possible, which yield analogous eigenvalue systems.

Analytical Approach for Computing the Sensitivity

For both the RCWA and the C method, the final algorithms show only matrix multiplications, which in simpler systems makes differentiation easy to apply. Unfortunately, in the present situation, some of the matrices involve eigenvalues and eigenvectors of the type mentioned in previous sections, which makes straightforward differentiation of these matrices difficult or impossible. This is why the finite difference method has been preferred.

According to an embodiment, it has been recognized that an analytical approach is possible and provides a more computationally efficient approach. The approach is based on calculating the eigenvalue and eigenvector derivatives directly and is described below in relation to the RCWA method (as an example).

Eigenvalue and Eigenvector Derivatives

Assume that the eigenvalues that occur in the RCWA algorithm are distinct, that is $\lambda_i \neq \lambda_j$ if $i \neq j$. Except for homogeneous layers, this assumption seems to be fair. The general eigenvalue system with matrix A, eigenvalue matrix $\Lambda$ and eigenvector matrix W is given by $$AW=W\Lambda$$

Differentiating the eigensystem with respect to a certain parameter p, yields $$A'W-W\Lambda'=W'\Lambda-AW',$$

where ' denotes a first derivative. The eigenvector derivatives can be projected onto the basis consisting of its own eigenvectors, that is W'=WC with C as coefficient matrix (this is possible because the matrix A of which the eigenvalues and eigenvectors are computed is "non-defect"; that is, if matrix A has dimension n, it also has n independent eigenvectors). Inserting this expansion into the above equation and premultiplying by the inverse eigenvector matrix $W^{-1}$, yields $$W^{-1}A'W-\Lambda'=C\Lambda-\Lambda C,$$

where the identity $W^{-1}AW=\Lambda$ has been used. This equation enables the computation of the eigenvalue derivatives, which are equal to the diagonal entries of $W^{-1}$ A'W, and of the off-diagonal entries of coefficient matrix C as can be seen if the equation is written out in full. The diagonal entries of the coefficient matrix C have not yet been computed. This is also not possible, since an eigenvector is only defined up to a constant anyway. When the eigenvectors are normalized in some way, they are fixed and for this normalization a unique eigenvector derivative can be computed. The normalization of the eigenvectors does not affect the answers provided by the overall method (whether using the C-method, RCWA or another such approach). It has been suggested (D. V. Murthy and R. T. Haftka, "Derivatives of Eigenvalues and Eigenvectors of a General Complex Matrix", International Journal for Numerical Methods in Engineering 26, 293-311 (1988)) to set for every eigenvector l, $w_{kl}=1$ where k is chosen such that $|w_{kl}||y_{kl}|=\max_m |w_{ml}||y_{ml}|$ since this choice gives maximal numerical stability. This condition relates the diagonal entry of coefficient matrix C to the off-diagonal entries and completes the coefficient matrix computation.

$$c_{kk} = -\sum_{l=1, l\neq k}^{n} w_{ml} c_{lk}$$

This equation comes from the fact that the normalization condition $w_{kl}=1$ holds for all p; differentiating this condition and using the expansion of the eigenvector derivative results in the equation. The second order derivatives of the eigenvalues and eigenvectors are computed in a similar way. The same eigensystem $AW=W\Lambda$ is differentiated twice to obtain $$A''W-W\Lambda''=-2A'W'+2W'\Lambda'+W''\Lambda-AW''$$

The second order eigenvector derivative is then expanded into its own eigenvectors: W''=WD. The equation is then premultiplied again with $W^{-1}$ to obtain $$W^{-1}A''W-\Lambda''=2\Lambda'C+2C\Lambda'+D\Lambda-\Lambda D+2\Lambda CC-2C\Lambda C$$

where the identity $W^{-1}A'W=\Lambda'+C\Lambda-\Lambda C$ is used. In a similar way as for the first order derivative, the second order derivatives of the eigenvalues and the off-diagonal entries of the coefficient matrix D can be found. Since the eigenvectors have already been normalized, this condition (that $W_{kl}=1$) can be used again to determine the diagonal elements of matrix D and therefore the second order derivatives of both eigenvalues and eigenvectors have been computed and this theory can be implemented into the RCWA sensitivity theory.

If it would occur that some eigenvalues are repeated, this eigenvalue and eigenvector derivatives theory could be extended. However, it is expected that such repeated eigenvalues will be encountered only rarely, if at all.

RCWA Analytical Sensitivity Theory

This section discusses the sensitivity theory for the enhanced transmittance matrix approach presented in FIG. 6 in more detail. In each case, the final equation (last row in FIG. 6) has to be solved in order to yield R and $T_2$ as follows for TE $$\begin{bmatrix} R \\ T_2 \end{bmatrix} = \begin{bmatrix} -I & F_2 \\ jY_1 & G_2 \end{bmatrix}^{-1} \begin{bmatrix} d_0 \\ jd_0 n_1 \cos\theta \end{bmatrix}$$

polarization, and for $$\begin{bmatrix} R \\ T_2 \end{bmatrix} = \begin{bmatrix} -I & F_2 \\ jZ_1 & G_2 \end{bmatrix}^{-1} \begin{bmatrix} d_0 \\ jd_0 \cos\theta/n_1 \end{bmatrix}$$

TM polarization.

When the final equation of the enhanced transmittance matrix approach as given in the last row of FIG. 6 is differentiated with respect to parameter p, the result is $$\begin{bmatrix} I \\ -jY_1 \end{bmatrix} \frac{\partial R}{\partial p} = \frac{\partial}{\partial p} \begin{bmatrix} F_2 \\ G_2 \end{bmatrix} T_2 + \begin{bmatrix} F_2 \\ G_2 \end{bmatrix} \frac{\partial T_2}{\partial p}.$$

The second order differentiation of this equation gives $$\begin{bmatrix} I \\ -jY_1 \end{bmatrix} \frac{\partial^2 R}{\partial p \partial q} = \frac{\partial^2}{\partial p \partial q}\begin{bmatrix} F_2 \\ G_2 \end{bmatrix} T_2 + \frac{\partial}{\partial p}\begin{bmatrix} F_2 \\ G_2 \end{bmatrix}\frac{\partial T_2}{\partial q} +$$
$$\frac{\partial}{\partial q}\begin{bmatrix} F_2 \\ G_2 \end{bmatrix}\frac{\partial T_2}{\partial p} + \begin{bmatrix} F_2 \\ G_2 \end{bmatrix}\frac{\partial^2 T_2}{\partial p \partial q}\begin{bmatrix} d_0 \\ jd_0 n_1 \cos\theta \end{bmatrix} + \begin{bmatrix} I \\ -jY_1 \end{bmatrix} R = \begin{bmatrix} F_2 \\ G_2 \end{bmatrix} T_2$$

where p and q are allowed to be the same parameter. As can be seen, the first term after the equality sign in the first equation and the first three terms after the equality sign in the second equation play the same role as the constant vector in the equation given earlier for TE polarization. Similar equations can be derived for TM polarization. With unknowns $$\frac{\partial R}{\partial p} \text{ and } \frac{\partial T}{\partial p}, \text{ and } \frac{\partial^2 R}{\partial p \partial q} \text{ and } \frac{\partial^2 T}{\partial p \partial q}$$

respectively, the solution of both equations involve exactly the same inverse matrix as the final step in the enhanced transmittance matrix approach.

A central challenge is the computation of first and second order derivatives of matrices $A_2$, $B_2$, $F_2$ and $G_2$, which involves computing all derivatives of $A_i$, $B_i$, $F_i$ and $G_i$ for $i=2, \ldots K+1$. In this regard, it is beneficial to know which shape parameter each matrix depends on before starting the differentiation. The general situation is expressed by the following shape parameter relations:

$$A_i = A_i(w_i, w_{K+1}, d_{i+1}, \ldots, d_{k+1}) W_i = W_i(w_i)$$
$$B_i = B_i(w_i, w_{K+1}, d_{i+1}, \ldots, d_{K+1}) V_i = V_i(w_i)$$
$$F_i = F_i(w_i, w_{K+1}, d_i, \ldots, d_{K+1}) Q_i = Q_i(w_i)$$
$$G_i = G_i(w_i, w_{K+1}, d_i, \ldots, d_{K+1}) X_i = X_i(w_i, d_i)$$

where $d_i$ is the layer thickness of layer i and $w_i$ is a vector consisting of all block widths inside layer i. Deriving the expressions for matrices $A_i$, $B_i$, $F_i$ and $G_i$ with respect to p gives:

$$\frac{\partial}{\partial p} A_i = \frac{1}{2}\left(\frac{\partial}{\partial p}(W_i^{-1} F_{i+1}) + \frac{\partial}{\partial p}(V_i^{-1} G_{i+1})\right)$$
$$\frac{\partial}{\partial p} B_i = \frac{1}{2}\left(\frac{\partial}{\partial p}(W_i^{-1} F_{i+1}) - \frac{\partial}{\partial p}(V_i^{-1} G_{i+1})\right)$$
$$\frac{\partial}{\partial p} F_i = \frac{\partial}{\partial p} W_i(I + X_i B_i A_i^{-1} X_i) + W_i \frac{\partial}{\partial p}(X_i B_i A_i^{-1} X_i)$$
$$\frac{\partial}{\partial p} G_i = \frac{\partial}{\partial p} V_i(I - X_i B_i A_i^{-1} X_i) - V_i \frac{\partial}{\partial p}(X_i B_i A_i^{-1} X_i).$$

Computing a derivative with respect to a layer thickness is less expensive than computing a derivative with respect to a block width, since the eigenvalues and eigenvector matrices (see the formula in preceding paragraph) do not depend on the layer thickness. When taking the shape parameter relations into account, these equation can be simplified in some situations. For example, if the shape parameter is in a layer above the layer you are looking at, the derivatives will all be equal to zero, since none of the matrices depend on this shape parameter. When the shape parameter is in a layer below the layer under consideration, the derivatives of the matrices involving eigenvalues and eigenvectors are zero.

In a similar way formulas for the second order derivatives can be derived, but now there are two shape parameters which can both be inside a layer below, inside or above the layer under consideration, so there are 6 situations that have to be considered separately. Using the expressions of eigenvalue and eigenvector derivatives completes the sensitivity theory and the derivatives of the reflected field amplitudes can be computed straightforwardly. The transmitted field amplitudes can also be computed, but an additional step has to be performed since all derivatives of $T_2$ have been computed.

The analytical sensitivity theory for the C method can be developed in an analogous way as for RCWA, but with the equations obtained for the C method. Also conical diffraction has just different equations, but in essence, the same procedure can be applied.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An optical metrology system, comprising:
   a measuring system configured to irradiate a metrology mark and record a portion of a reflected, a transmitted, or both, electromagnetic field; and
   a characterization device configured to determine from the recorded field a mark shape parameter indicative of a structure of the metrology mark, the characterization device comprising:
      a field calculation unit configured to calculate an expected field for reflection, transmission, or both, from a theoretical reference mark based on an algebraic eigenvalue-eigenvector representation of the expected field, wherein the algebraic eigenvalue-eigenvector representation of the expected field comprises a matrix A, characterized by eigenvector matrix $W$ and eigenvalue matrix $\Lambda$ according to an eigenvalue system equation defined by $AW=W\Lambda$,
      a field derivative calculation unit configured to calculate a first order derivative, a higher order derivative, or both, of the expected field with respect to the mark shape parameter by first deriving analytical forms of derivatives corresponding to eigenvalues and eigenvectors of the eigenvalue-eigenvector representation, and
      an optimization unit configured to determine an optimized mark shape parameter for which the expected field substantially matches the recorded field based on outputs from the field and field derivative calculation units.

2. The system according to claim 1, wherein:
   the field calculation unit is configured to solve a second order differential equation for the expected field; and
   the eigenvalues and eigenvectors of the eigenvalue-eigenvector representation are eigenvalues and eigenvectors of a coefficient matrix of the second order differential equation.

3. The system according to claim 1, wherein the metrology mark of a substrate comprises a metrology mark with a periodic structure along an axis within a plane of the substrate.

4. The system according to claim 1, wherein the metrology mark comprises a one-dimensional grating, a two-dimensional grating, or both.

5. The system according to claim 1, wherein the field calculation unit is configured to calculate the expected field using a Rigorous Coupled-Wave Analysis (RCWA), a C-method, or both.

6. The system according to claim 1, wherein the optimization unit is configured to search for an optimal mark shape parameter based on a starting parameter that corresponds to an expected distortion of an alignment mark.

7. The system according to claim 6, wherein the expected distortion is derived based on a process history of a substrate.

8. The system according to claim 1, wherein:
   the field derivative calculation unit is configured to determine first derivatives of the eigenvalue matrix $\Lambda$, denoted by $\Lambda'$, using the following expression:

$$W^{-1}A'W - \Lambda' = C\Lambda - \Lambda C,$$

the eigenvector derivatives of $W$, denoted by $W'$, are projected onto a basis consisting of the eigenvectors $W$ according to a relation $W'=WC$, with $C$ as a coefficient matrix.

9. The system according to claim 1, wherein:
   the field derivative calculation unit is configured to determine second derivatives of the eigenvalue matrix $\Lambda$, denoted by $\Lambda''$, using the following expression:

$$W^{-1}A''W - \Lambda'' = 2\Lambda'C + 2C\Lambda' + D\Lambda - \Lambda D + 2\Lambda CC - 2C\Lambda C,$$

the first eigenvector derivatives of $W$, denoted by $W'$, are projected onto a basis consisting of the eigenvectors $W$ according to a relation $W'=WC$, with $C$ as a coefficient matrix, and
   the second eigenvector derivatives of $W$, denoted by $W''$, are projected onto a basis consisting of the eigenvectors $W$ according to a relation $W''=WD$, with $D$ as a coefficient matrix.

10. A lithographic apparatus, comprising:
    an optical metrology system, including:
       a measuring system configured to irradiate an alignment mark on a substrate and record a portion of a reflected from the substrate, a transmitted through the substrate, or both, electromagnetic field;
       a characterization device configured to determine from the recorded field a mark shape parameter indicative of a structure of an alignment mark, the characterization device comprising:
          a field calculation unit configured to calculate an expected field for reflection, transmission, or both, from a theoretical reference mark based on an algebraic eigenvalue-eigenvector representation of the expected field, wherein the algebraic eigenvalue-eigenvector representation of the expected field comprises a matrix A, characterized by eigenvector matrix $W$ and eigenvalue matrix $\Lambda$ according to an eigenvalue system equation defined by $AW=W\Lambda$,
          a field derivative calculation unit configured to calculate a first order derivative, a higher order derivative, or both, of the expected field with respect to the mark shape parameter by first deriving analytical forms of derivatives corresponding to eigenvalues and eigenvectors of the eigenvalue-eigenvector representation, and
          an optimization unit configured to determine an optimized mark shape parameter for which the expected field substantially matches the recorded field based on outputs from the field and field derivative calculation units; and
    a substrate position determining device configured to derive a position of the substrate using the optimized mark shape parameter determined by the characterization device.

11. The apparatus according to claim 10, wherein the substrate position determining device is configured to derive a position of the substrate by reference to a center of symmetry of the theoretical reference mark as defined by the optimized mark shape parameter.

12. The apparatus according to claim 10, wherein the field calculation unit is configured to calculate the expected field using a Rigorous Coupled-Wave Analysis (RCWA), a C-method, or both.

13. A method of characterizing a metrology mark, comprising:
    irradiating a metrology mark and recording a portion of a reflected, a transmitted, or both, electromagnetic field;
    determining from the recorded field a mark shape parameter indicative of a structure of the metrology mark;
    calculating an expected field for reflection, transmission, or both, from a theoretical reference mark based on an algebraic eigenvalue-eigenvector representation of the expected field, wherein the algebraic eigenvalue-eigenvector representation of the expected field comprises a matrix A, characterized by eigenvector matrix W and eigenvalue matrix Λ according to an eigenvalue system equation defined by AW=WΛ;

calculating a first order derivative, a higher order derivative, or both, of the expected field with respect to the mark shape parameter by first deriving analytical forms of derivatives corresponding to eigenvalues and eigenvectors of the eigenvalue-eigenvector representation; and determining an optimized mark shape parameter for which the expected field substantially matches the recorded field based on results from the calculating the expected field for reflection, transmission, or both, and the calculating the first order derivative, a higher order derivative, or both, of the expected field.

14. The method according to claim 13, wherein calculating the expected field for reflection, transmission, or both, comprises using a Rigorous Coupled-Wave Analysis (RCWA), a C-method, or both.

15. The method according to claim 13, wherein determining the optimized mark shape parameter comprises selecting a starting parameter according to an expected distortion of an alignment mark.

16. A device manufacturing method, comprising:
irradiating a metrology mark on a substrate and recording a portion of a reflected from the substrate, a transmitted through the substrate, or both, electromagnetic field;
determining from the recorded field a mark shape parameter indicative of a structure of the metrology mark;
calculating an expected field for reflection, transmission, or both, from a theoretical reference mark based on an algebraic eigenvalue-eigenvector representation of the expected field, wherein the algebraic eigenvalue-eigenvector representation of the expected field comprises a matrix A, characterized by eigenvector matrix W and eigenvalue matrix Λ according to an eigenvalue system equation defined by AW=WΛ;
calculating a first order derivative, a higher order derivative, or both, of the expected field with respect to the mark shape parameter by first deriving analytical forms of derivatives corresponding to eigenvalues and eigenvectors of the eigenvalue-eigenvector representation;
determining an optimized mark shape parameter for which the expected field substantially matches the recorded field based on results from the calculating the expected field for reflection, transmission, or both, and the calculating the first order derivative, a higher order derivative, or both, of the expected field; and
aligning the substrate using the result of the characterization.

17. The method according to claim 16, wherein calculating the expected field for reflection, transmission, or both, comprises using a Rigorous Coupled-Wave Analysis (RCWA), a C-method, or both.

18. The method according to claim 16, wherein determining the optimized mark shape parameter comprises selecting a starting parameter according to an expected distortion of an alignment mark.

* * * * *